United States Patent
Tei et al.

[11] Patent Number: 6,144,025
[45] Date of Patent: Nov. 7, 2000

[54] LASER LIGHT SOURCE APPARATUS

[75] Inventors: Daikou Tei, Seto; Naoyuki Mekada, Komaki, both of Japan

[73] Assignee: Santec Corporation, Komaki, Japan

[21] Appl. No.: 09/229,263

[22] Filed: Jan. 13, 1999

[51] Int. Cl.[7] .................................................. G01J 3/50
[52] U.S. Cl. ............................ 250/226; 250/206; 372/9; 372/12; 372/23
[58] Field of Search .................................. 250/205, 206, 250/227.11, 227.14; 372/9, 12, 23

[56] References Cited

U.S. PATENT DOCUMENTS

| 4,957,362 | 9/1990 | Peterson | 356/5 |
| 5,715,269 | 2/1998 | Shinji | 372/55 |
| 6,046,810 | 4/2000 | Sanders et al. | 356/350 |

FOREIGN PATENT DOCUMENTS

| 56-126602 | 2/1955 | Japan . |
| 56-55087 | 5/1981 | Japan . |
| 58-97882 | 6/1983 | Japan . |
| 61-72209 | 4/1986 | Japan . |
| 62-119993 | 6/1987 | Japan . |
| 4-157780 | 5/1992 | Japan . |
| 6-281812 | 10/1994 | Japan . |

*Primary Examiner*—Georgia Epps
*Assistant Examiner*—Tim Thompson
*Attorney, Agent, or Firm*—McDermott, Will & Emery

[57] ABSTRACT

The light emitted by a laser diode 1 is entered into a beam splitter 5, and its reflected light is given to an optical band pass filter 8. The light passing through the optical band pass filter 8 is received by a photo diode PD1.

The light once reflected by the optical band filter 8 and passing through the beam splitter 5 is received by a photo diode PD2. The reception ratio of the photo diodes PD1, PD2 is calculated in output ratio calculator 9. By controlling the emission wavelength of the laser diode 1 so that its ratio may be constant, laser light of high precision and stable wavelength is emitted.

30 Claims, 14 Drawing Sheets

F I G. 6
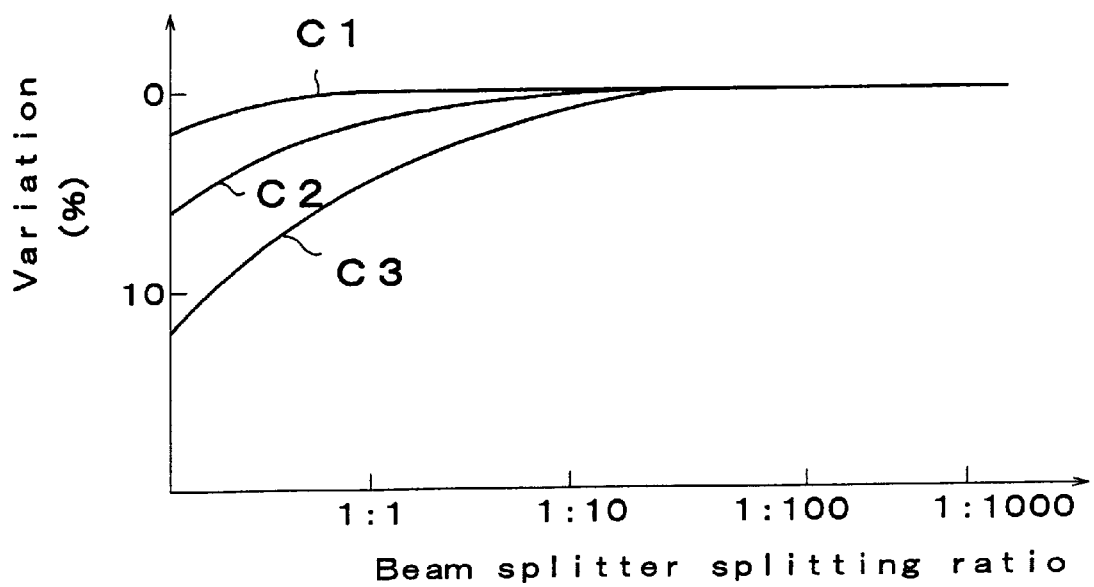
F I G. 7
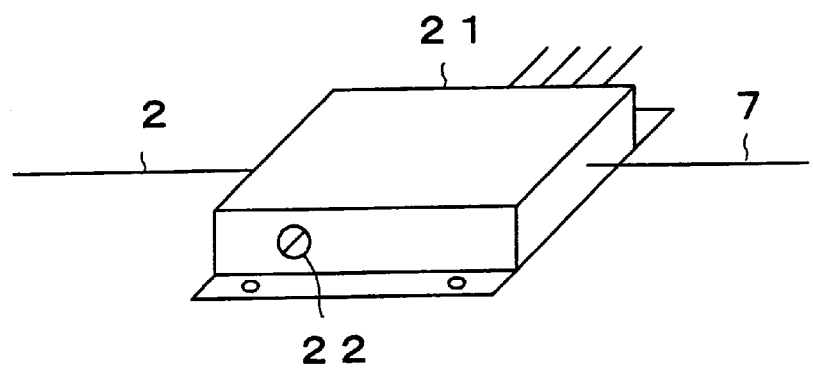

FIG. 9
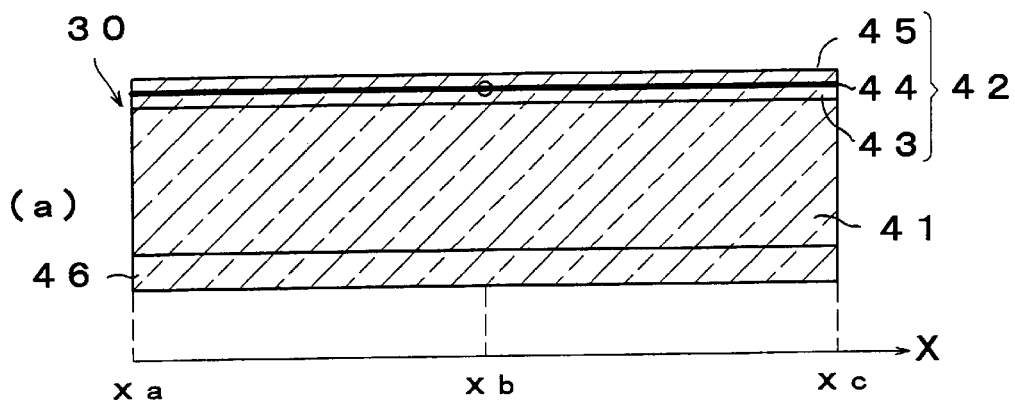
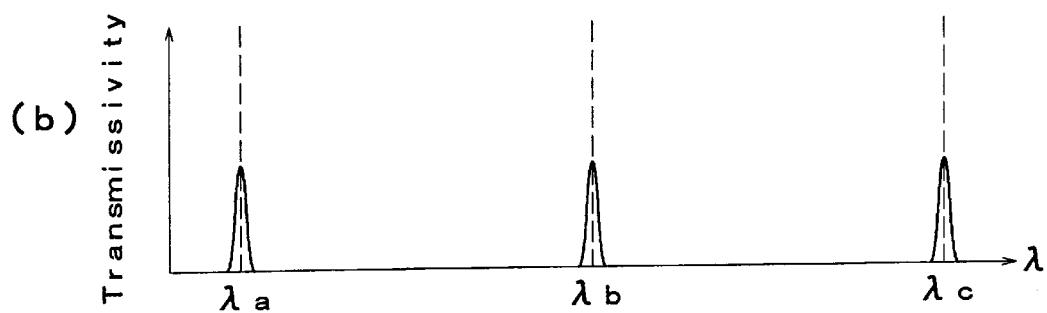
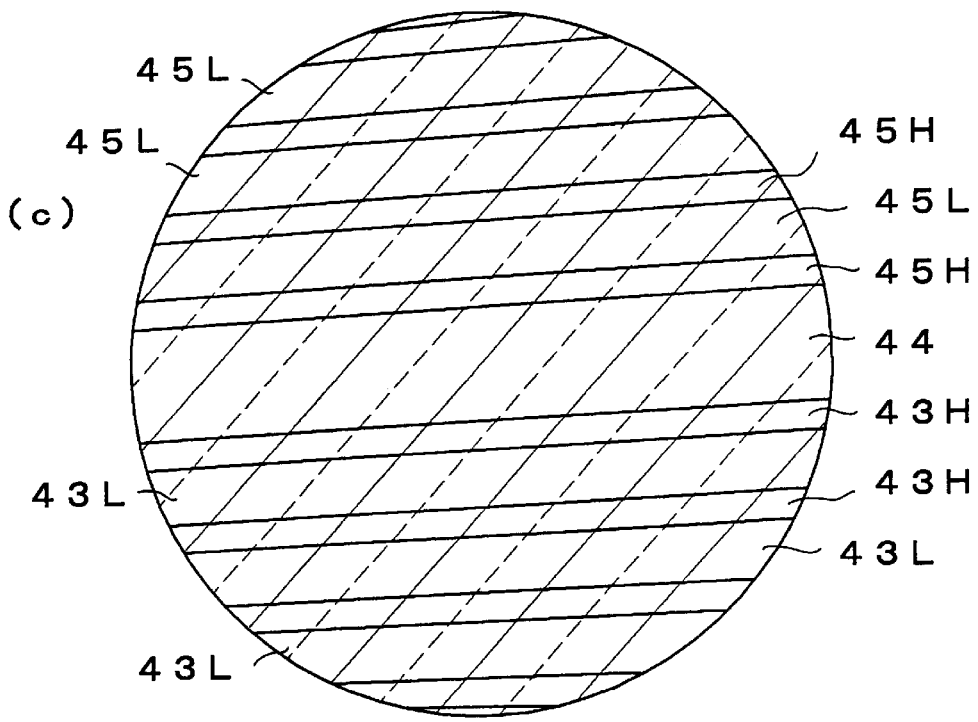

FIG. 14
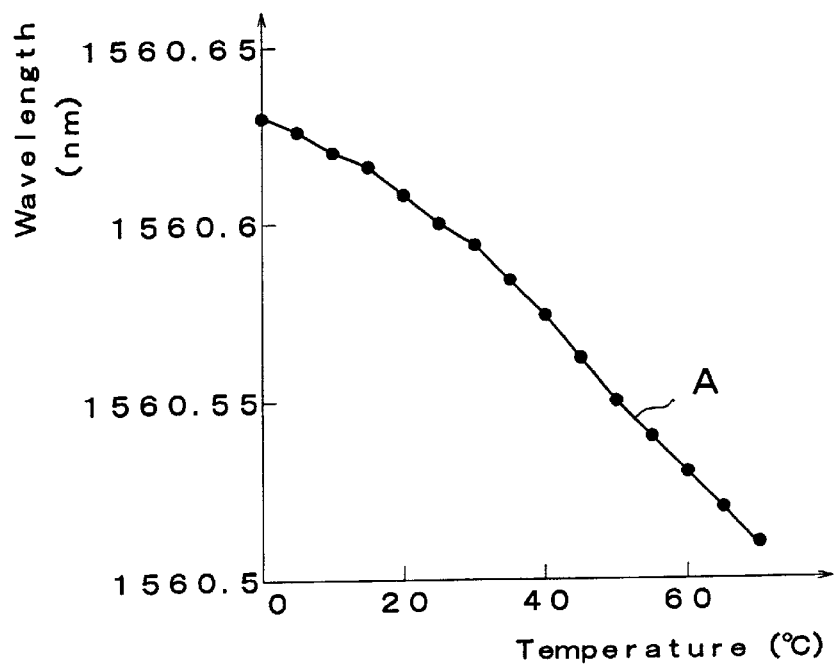
(a)
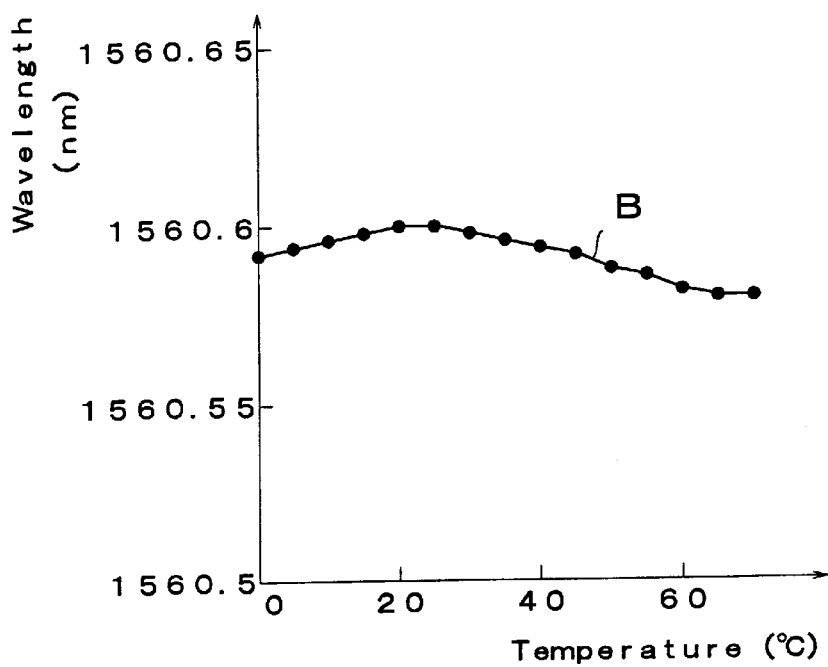
(b)

LASER LIGHT SOURCE APPARATUS

FIELD OF THE INVENTION

The present invention relates to a laser light source apparatus for stabilizing a wavelength of a laser light source used in light communication or the like.

PRIOR ART

In optical communication, at the present, by multiplexing light of multiple wavelengths in an optical fiber and transmitting, a wavelength division multiplex communication system is being studied in order to increase the quantity of transmission substantially as compared with the case of using light of single wavelength. To realize the wavelength division multiplex communication, the wavelength of the laser light source must be stabilized sufficiently in order to transmit laser light of multiple wavelengths within a relatively narrow wavelength band capable of amplifying the optical signal directly, for example, at an interval of 1 nm or less. Moreover, in an optical information processing or optical measurement, the stabilization of the wavelength of the laser light source is an important subject for enhancing the density of information and improving precision of the measurement.

To stabilize the emission wavelength of the laser light source, for example, using an element having a reference wavelength characteristic by some way or other, an error from the emission wavelength is detected, and is fed back to the laser light source. Up to now, using the atom or molecule absorption as the reference, an apparatus for stabilizing the wavelength, and methods of adjusting wavelength by modulating the wavelength of reference light or light source by dither, using holography, grating, Mach-Zehnder interferometer or Fabry-Perot interferometer have been known. Dither is to oscillate the light wavelength slightly by some way, so that the difference from the reference wavelength and direction may be distinguished. By feeding back the distinguishing result to the laser light source, the emission wavelength is stabilized. It is also known to stabilize the emission wavelength of a laser light source by using multi-layer interference optical filter or an etalon as reference wavelength.

In such conventional methods, however, the light of the light source such as a laser diode is modulated by changing the emission wavelength by giving a delicate change to the light source by the dither, judging the wavelength changing direction electrically, and detecting the difference from the reference to feed back to the light source. It is hence possible to overlap with the modulation signal as information. To eliminate such effects of the dither, a low pass filter or an electric filter is indispensable. Besides, the control system is complicated because of the dither, and if the dither is accompanied by movable parts, the reliability is low and the life is shortened.

To utilize stabilized light, laser light is split by using a beam splitter, and the split light is added to a wavelength stabilizing apparatus, while the remainder is used as stabilized laser light. Accordingly, a beam splitter is needed aside from the wavelength stabilizing apparatus.

SUMMARY OF THE INVENTION

The present invention is devised in the light of the problems of the prior arts, and it is hence an object thereof to present a laser light source apparatus capable of emitting laser light of a stabilized wavelength at high precision in an extremely simple constitution by integrating a beam splitter and a wavelength stabilizing apparatus.

The laser light source apparatus of the invention having such features comprises a laser light source capable of changing continuously the wavelength of light, a beam splitter for receiving laser light of the laser light source and splitting the incident laser light into transmitted light and split light, an optical filter for receiving the split light from the beam splitter, transmitting light of specified wavelength, and reflecting the remainder to enter again in the beam splitter, a first photo detector for receiving the transmitted light from the optical filter, a second photo detector for receiving the light passing through the beam splitter out of the split light reflected by the optical filter, an output ratio calculator for calculating the output ratio of the first and second photo detectors, and a wavelength controller for controlling the emission wavelength of the light source so that the output ratio by the output ratio calculator may be a specified value.

Laser light is emitted from the laser light source, and is entered into the beam splitter. The beam splitter is to pass part of the light, and split the remainder, and the split laser light is entered into the optical filter. The optical filter passes light of specified wavelength, and reflects the remainder. The light passing through the optical filter and the light once reflected and passing again through the beam splitter are respectively detected by the first and second photo detectors, and their output ratio is calculated by the output ratio calculator. By controlling the emission wavelength of the laser light source so that the output ratio may be a specified value, laser light of specified wavelength can be emitted.

Such optical filter can be realized by an interference optical filter by multi-layer films. Such optical filter is realized as an interference optical filter of variable wavelength type composed so as to vary continuously the transmission wavelength in a specific direction. In this case, by changing the incident position of the laser light in the interference optical filter, the emission wavelength of the laser light source can be changed. By setting a reference value in a reference value setting unit, the difference between the output ratio and reference value is detected as error by an error detector. By controlling the laser light source so that the error may be zero by means of a light source driver, fine adjustment of emission wavelength of the laser light source is achieved. Moreover, by installing a cut filter between the light source and the optical filter, only one slope portion of the characteristic of optical filter can be defined as a lock point. By detecting the ambient temperature and compensating for the output of the output ratio calculator, laser light of specific wavelength can be issued regardless of the effects of ambient temperature.

BRIEF DESCRIPTION OF THE DRAWINGS

FIG. 6 is a graph showing changes of variation of output of photo diodes PD1, PD2 in relation to splitting ratio of the beam splitter.

FIG. 7 is a perspective view showing a constitution of a light splitting and wavelength locking module in the first embodiment.

FIG. 9(a) is a sectional view showing a constitution of an interference optical filter in single cavity structure in the second embodiment of the invention, (b) is a graph showing changes of transmissivity on its X-axis, and (c) is a magnified sectional view of circular portion of (a).

FIG. 14(a) and FIG. 14(b) are graphs showing the relation of ambient temperature and the emission wavelength before temperature compensation and after temperature compensation.

DESCRIPTION OF THE PREFERRED EMBODIMENTS

Figure 1:
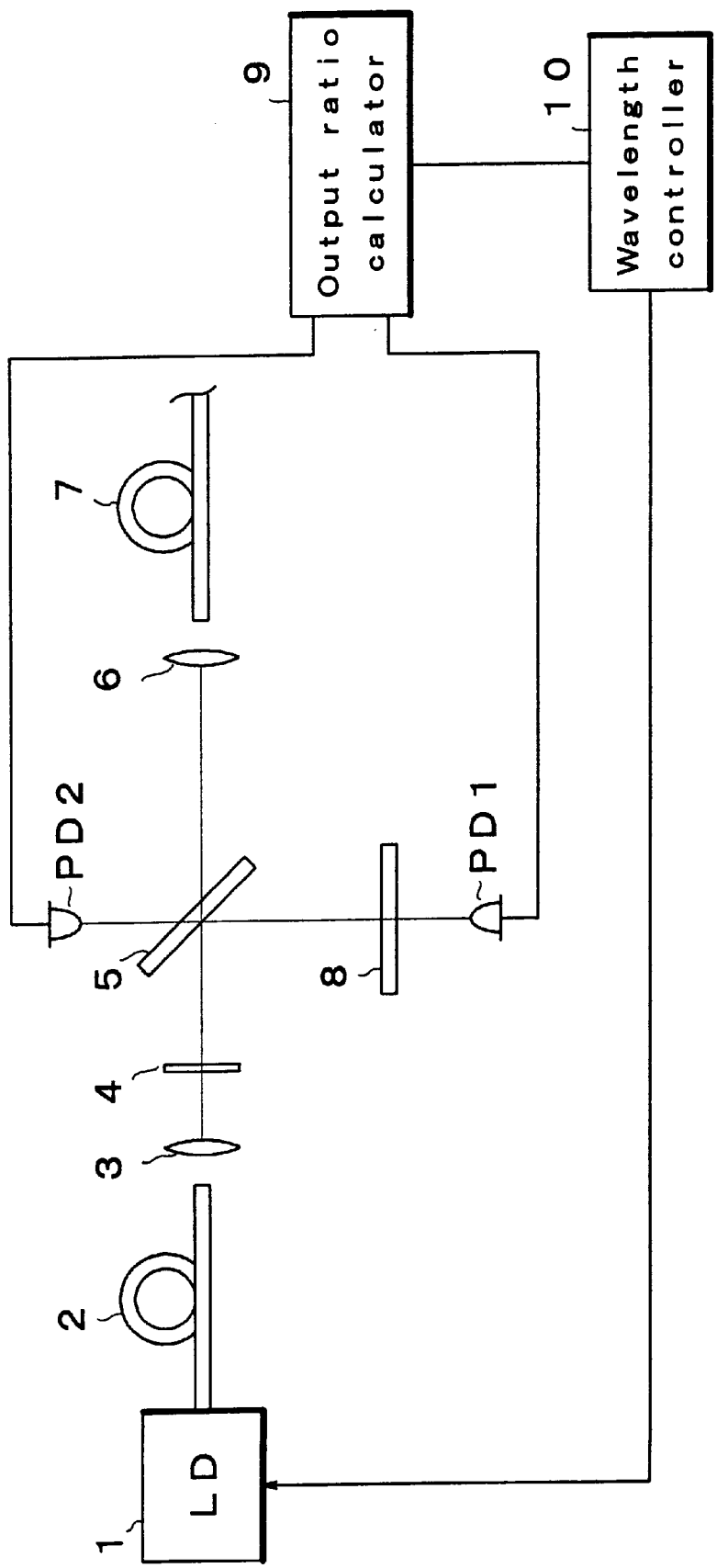
FIG. 1 is a block diagram showing an entire constitution of a laser light source apparatus in a first embodiment of the invention.

FIG. 1 is a block diagram showing an entire constitution of a laser light source apparatus in a first embodiment of the invention. In the diagram, the laser light source apparatus includes a laser light source, such as a laser diode (LD) 1 of distributed feedback type, which emits laser light of one line spectrum. The emission wavelength of this laser light source can be controlled from outside in a range of, for example, 2 to 3 nm by current or temperature control. This laser light is guided into an optical fiber 2. A lens 3 and a cut filter 4 are disposed at the end of the optical fiber 2 in this order. The lens 3 transforms an incident light from the optical fiber 2 into parallel light. The cut filter 4 is to cut the incident light of the shorter wavelength than the possible setting wavelength range of the apparatus, and the light passing through the cut filter 4 is given to a beam splitter 5. The beam splitter 5 is to split the light by transmitting part of the incident light and reflecting the remainder. The beam splitter 5 is composed, for example, by evaporating a metal film or dielectric multi-layer films on a transparent substrate, such as a glass substrate. The transmitted light is entered in an optical fiber 7 through a lens 6. At the other end of the optical fiber 7, a measuring device or a light communication appliance using stabilized laser light as light source is connected. The light split by the beam splitter 5 is given to an optical band pass filter(OBPF) 8. The optical band pass filter 8 is composed to possess a specific transmission wavelength band, and is disposed vertically to the split laser beam. A first photo detector, that is, a photo diode PD1 is disposed at a position for receiving the transmitted light from the optical band pass filter 8. A second photo detector, that is, a photo diode PD2 is disposed at a symmetrical position to the photo diode PD1 with respect to the optical band pass filter 8, that is the position for receiving the reflected light from the optical band pass filter 8 passing through the beam splitter 5. The output signals of the photo diodes PD1, PD2 are given to an output ratio calculator 9. The output ratio calculator 9 is to calculate the output ratio of the photo diodes PD1 and PD2, and its output signal is given to a wavelength controller 10. The wavelength controller 10 is to control the emission wavelength of the laser diode 1 so that the output ratio of the output ratio calculator 9 may be a specified value. The emission wavelength of the laser diode 1 is controlled by changing the driving current of the laser diode 1, or changing the ambient temperature.

Figure 2:
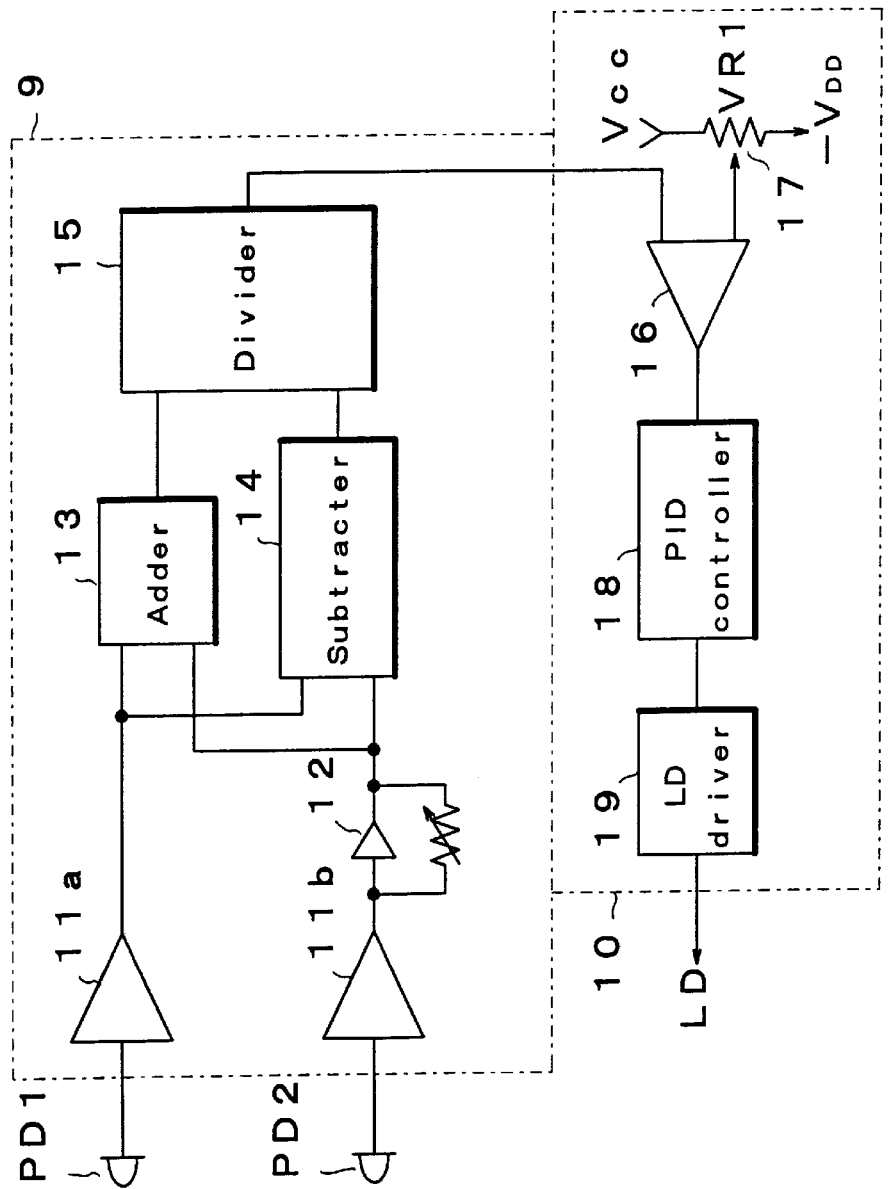
FIG. 2 is a block diagram showing a constitution of output ratio calculator and wavelength controller of the laser light source apparatus in the first embodiment of the invention.

Examples of the output ratio calculator 9 and wavelength controller 10 are further specifically described by referring to FIG. 2. The output signals from the first and second photo diodes PD1, PD2 are given to I/V converters 11a, 11b in the output ratio calculator 9, and converted into voltage signals. The output signal of the I/V converter 11b is given to an amplifier 12. The amplifier 12 has an amplification factor corresponding to the splitting ratio of the beam splitter 5 mentioned below in order to compensate the output level of the photo diode PD2. The output signals of the I/V converter 11a and amplifier 12 are given to an adder 13 and a subtracter 14, and the outputs of the adder 13 and subtracter 14 are given to a divider 15. The divider 15 normalizes the light received in the photo diodes PD1, PD2, and detects the wavelength of the incident light on the basis of their output ratio. Herein, the I/V converters 11a, 11b, the amplifier 12, the adder 13, the subtracter 14, and the divider 15 compose the output ratio calculator 9 for detecting the wavelength of laser light by the output ratio of the first and second photo detectors, and its output is given to one end of an error detector 16. A reference voltage is given to the other input end of the error detector 16. This reference voltage is designed to be adjusted in a range of $+V_{CC}$ to $-V_{DD}$ by a reference value adjuster 17, for example, a variable resistor VR1. The error detector 16 detects the difference between this reference voltage and input voltage as an error signal, and gives the error signal to a PID controller 18. The PID controller 18 is responsible for PID control so that the error signal may be 0, and its output is fed back to the laser diode 1 through a laser diode driver 19. The laser diode driver 19 controls the current flowing in the laser diode 1, or the temperature of the laser diode 1, and controls to change the emission wavelength of the laser diode 1 in a range of, for example, 2 to 3 nm or less. Herein, the error detector 16, the variable resistor VR1, the PID controller 18, and the laser diode driver 19 compose the wavelength controller 10 for controlling the emission wavelength of the laser light source so that the output ratio by the output ratio calculator 9 may be a specified value.

The optical band pass filter 8 is a multi-layer optical interference filter laminating alternately high refractive index films and low refractive index films having the optical film thickness of a quarter of transmission wavelength $\lambda$. Moreover, by installing a cavity layer in an optical film thickness of half wavelength between the high and low refractive index films, the optical band pass filter characteristic for transmitting light of a specific wavelength is composed.

In this embodiment, the operation of the laser light source apparatus is described below. The laser light oscillated by the laser diode 1 is entered into the cut filter 4 through the optical fiber 2 and lens 3. FIG. 3(a) is a graph showing the characteristic of transmissivity of the cut filter 4, and FIG. 3(b) and (c) are graphs showing the characteristics of transmissivity and reflectivity of the optical band pass filter 8, respectively. The cut filter 4 preliminary selects such cut-off characteristic as to transmit the light of longer wavelength than the center wavelength λ1 of the optical band pass filter 8, and cut off the light of shorter wavelength than this wavelength. The light passing through the cut filter 4 is entered into the beam splitter 5. Here, the splitting and transmitting ratio of the beam splitter 5 is set at 1:N. Hereinafter, this is called the splitting ratio N for short. The laser light passing through the beam splitter 5 is entered into the optical fiber 7 through the lens 6. On the other hand, the split light reflected by the beam splitter 5 enters the optical band pass filter 8. Only a part thereof passes through the optical band pass filter 8, and enters the photo diode PD1. The optical band pass filter 8 has such characteristic as to transmit the light of wavelength close to the wavelength λ1 and reflect the other light as shown in FIGS. 3(b) and (c). Therefore, the light reflected by the optical band pass filter 8 enter again the beam splitter 5, and is partly split by the ratio 1:N, and the transmitted light enter the photo diode PD2. At this time, at the emission wavelength λ of the laser diode 1, the reception levels obtained in the photo diodes PD1, PD2 are as shown in FIGS. 3(d), (e), respectively. The amplifier 12 is to compensate an output level drop of the photo diode PD2 accompanying light splitting in the beam splitter 5. Thus, the output obtained in the I/V converter 11a and amplifier 12 correspond to the transmissivity in FIG. 3(b) and reflectivity in FIG. 3(c), respectively.

Figure 4:
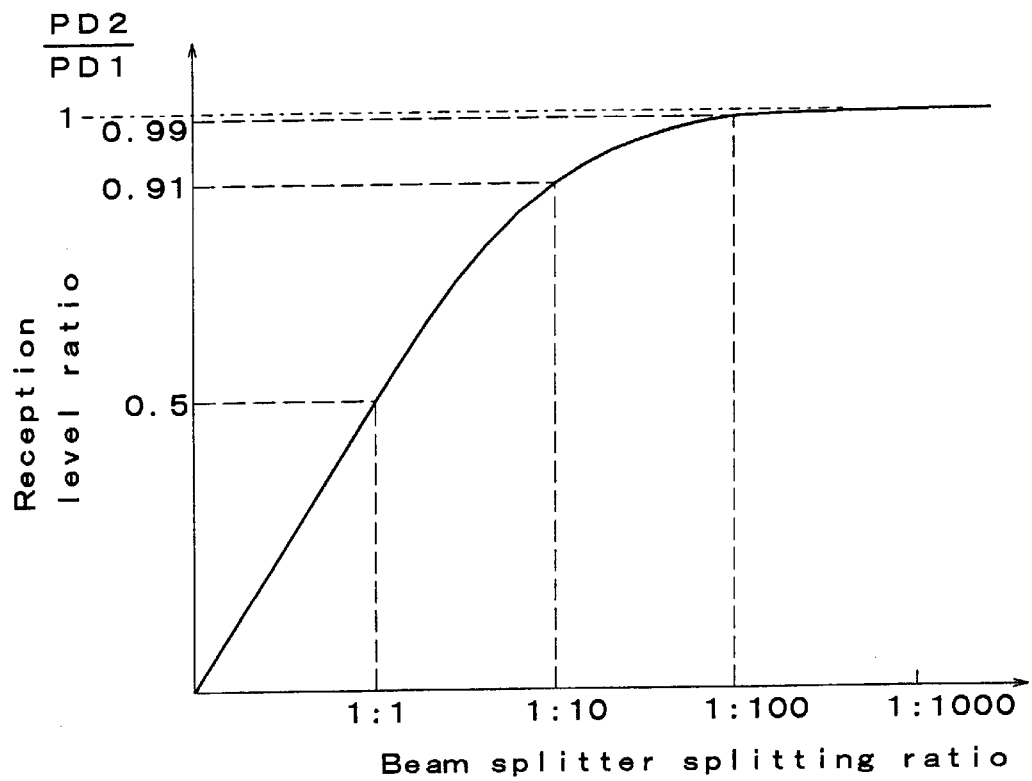
FIG. 4 is a diagram showing a reception level ratio of photo diodes in relation to splitting ratio of the beam splitter.

The level of the transmitted light entering the photo diode PD2 is determined by the splitting and transmitting ratio 1:N of the beam splitter 5 and the emission wavelength of the laser diode 1. For example, supposing the emission wavelength of the laser diode 1 is fixed so as to be equal in the level of transmission and reflection of the optical band pass filter 8, in the case the splitting and transmitting ratio of the beam splitter 5 is 1:1, the reception ratio of the PD2 to the photo diode PD1 is fixed at the wavelength so as to be 0.5 as shown in FIG. 4. In this case, in order that the output signals of the I/V converter 11a and the amplifier 12 should be equal to each other, the amplification factor of the amplifier 12 should be preferably two times. Similarly, when the splitting and transmitting ratio of the beam splitter 5 is 1:10, the reception ratio of the PD2 to the photo diode PD1 is 0.91. Hence, in order that the output signals of the I/V converter 11a and the amplifier 12 should be equal to each other, the amplification factor of the amplifier 12 should be preferably 10/9. When the splitting and transmitting ratio of the beam splitter 5 is 1:100, the reception ratio of the PD2 to the photo diode PD1 is 0.99. Thus, by setting a large splitting ratio N, the reception level ratio of PD1 and PD2 becomes closer to 1 as shown in FIG. 4. The amplification factor of the amplifier 12 is selected so that the input levels in the adder 13 and subtracter 14 may be equal in the center wavelength in a possible setting range. Therefore, when the splitting ratio N is sufficiently large, the gain of the amplifier 12 may be 1, and the amplifier 12 may not be necessary. Alternatively, instead of the amplifier 12, an attenuator may be provided at the output of the I/V converter 11a as far as it has an attenuation ratio corresponding to the splitting and transmitting ratio of 1:N so that the input level may be equal at this center wavelength. The amplifier 12 or attenuator is a gain controller for adjusting the output levels of the photo detectors PD1, PD2 so that the input levels in the adder 13 and subtracter 14 may be equal to each other at the center wavelength in a possible setting range.

Figure 3:
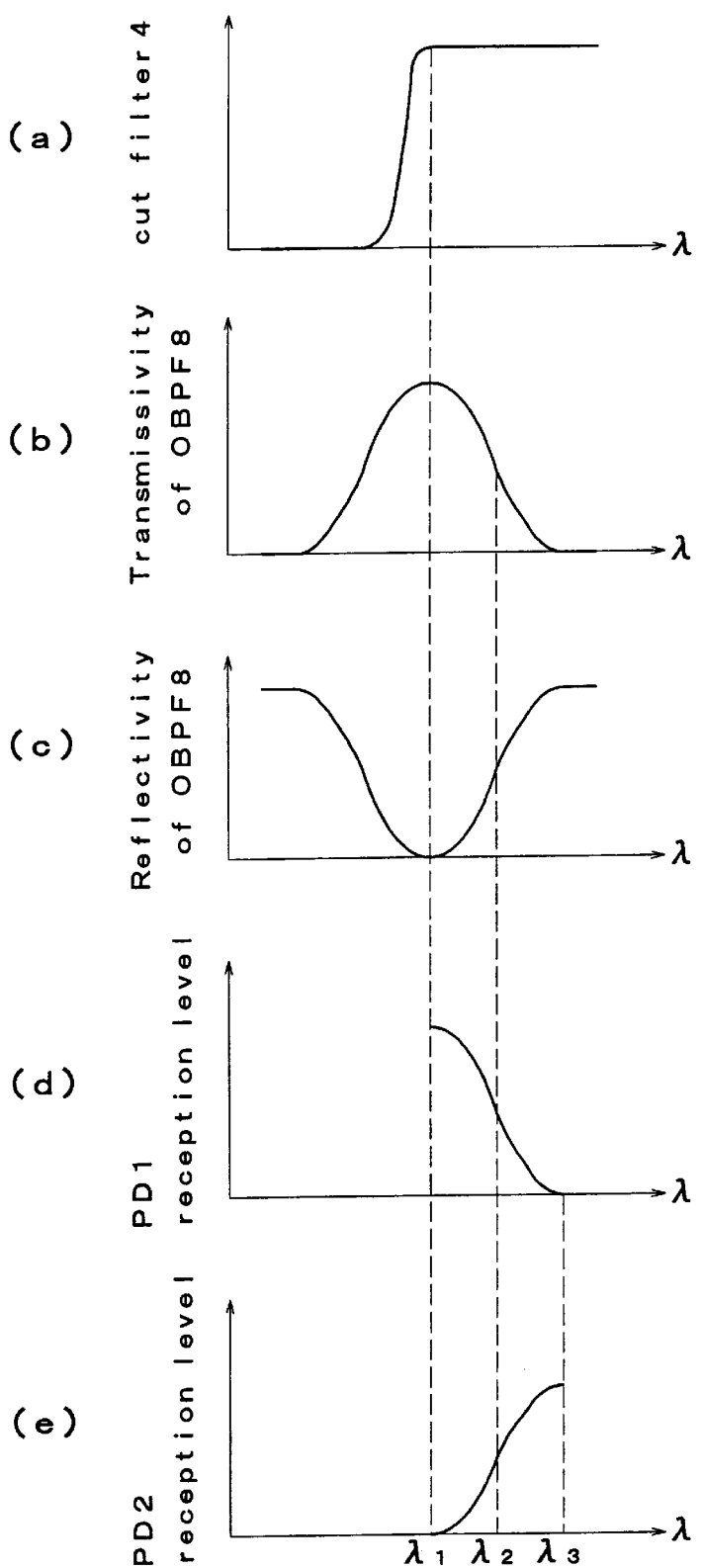
FIG. 3(a) through FIG. 3(e) are graphs showing characteristic changes of a cut filter, a band pass filter and photo diodes PD1, PD2 in relation to the emission wavelength of the laser light source.
Figure 5:
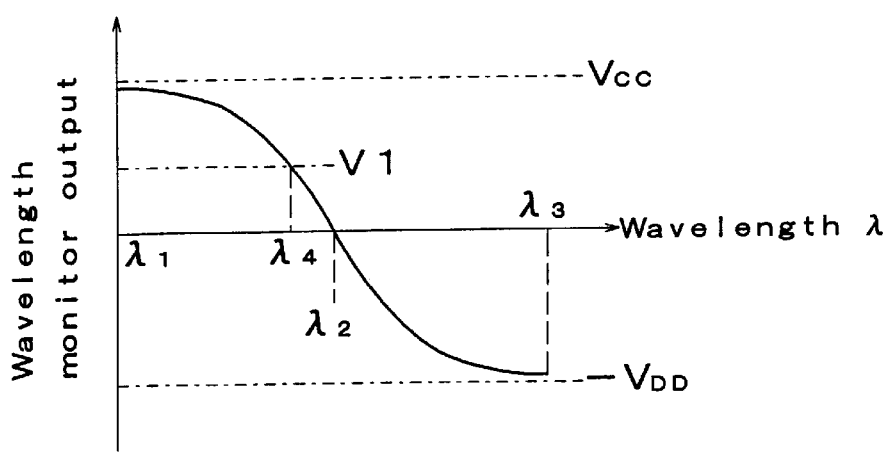
FIG. 5 is a graph showing changes of error signal in relation to the emission wavelength of the laser light source.

Supposing the I/V conversion output signals of the photo diode PD1, and the output of the amplifier 12 to be A and B, they are added, subtracted, and divided in the adder 13, subtracter 14, and divider 15, and (A−B)/(A+B) is calculated. The level normalized by the division is as shown in FIG. 5. Thus, in a range of wavelength λ1 to λ3, the wavelength monitor signal changes continuously depending on the emission wavelength of the laser diode 1. Thus, detecting the differential value of the wavelength monitor signal and the reference voltage of the error detector 16 as error signal, and controlling to nullify the error signal, the wavelength of the laser diode 1 may be controlled so as to coincide with the reference voltage set in the error detector 16. For example, supposing the reference voltage to be 0 V, when the output levels of PD1, and the amplifier 12 are equal at wavelength λ2 in emission, the error signal is 0, so that the emission wavelength of the laser diode 1 may be controlled at λ2. By setting the reference voltage at level V1 in FIG. 5, the wavelength is locked at the shorter wavelength side of λ4. By such adjustment of the reference voltage of the adjuster 17, the emission wavelength of the laser light source may be finely adjusted in a range of wavelengths λ1 to λ3 as shown in FIG. 3 and FIG. 5.

Herein, the bean splitter 5 used for splitting the laser light has a specified splitting ratio, but the splitting ratio may fluctuate in a certain range depending on the temperature, plane of polarization or the like. If the splitting ratio varies depending on such changes in the temperature or plane of polarization, the levels of the light received in two photo diodes PD1, PD2 change. However, when the splitting ratio N of the beam splitter 5 is set larger, the ratio of variation received in the two diodes PD1, PD2 becomes smaller as shown in FIG. 6. FIG. 6 shows the variation indicated by curves C1, C2, C3 about three beam splitters 5 with the variation of splitting ratio N of ±0.1%, ±1% and ±10%, respectively. Thus, when the splitting ratio N of the beam splitter 5 is large, if using a beam splitter large in fluctuation of splitting ratio N, the variation is small and is nearly 0%, so that the wavelength of the laser light can be fixed precisely at specified wavelength.

FIG. 7 is a perspective view showing the state of putting the splitting and wavelength locking portion, other than the laser light source of the laser light source apparatus in the first embodiment, into a case 21 as one module. In this embodiment, part of laser light is entering through the optical fiber 2, and the transmitted light of the beam splitter is issued from the optical fiber 7. In this case, moreover, the power source supply line and monitor output line are provided. In the case 21, there is a knob 22 for fine adjustment of emission wavelength by adjusting the resistance value of a variable resistor VR1. Without exposing such knob outside, the case may be formed in an airtight structure. Or, without using the optical fiber 2, the laser light source apparatus may be composed by putting the laser diode 1 in the case.

Figure 8:
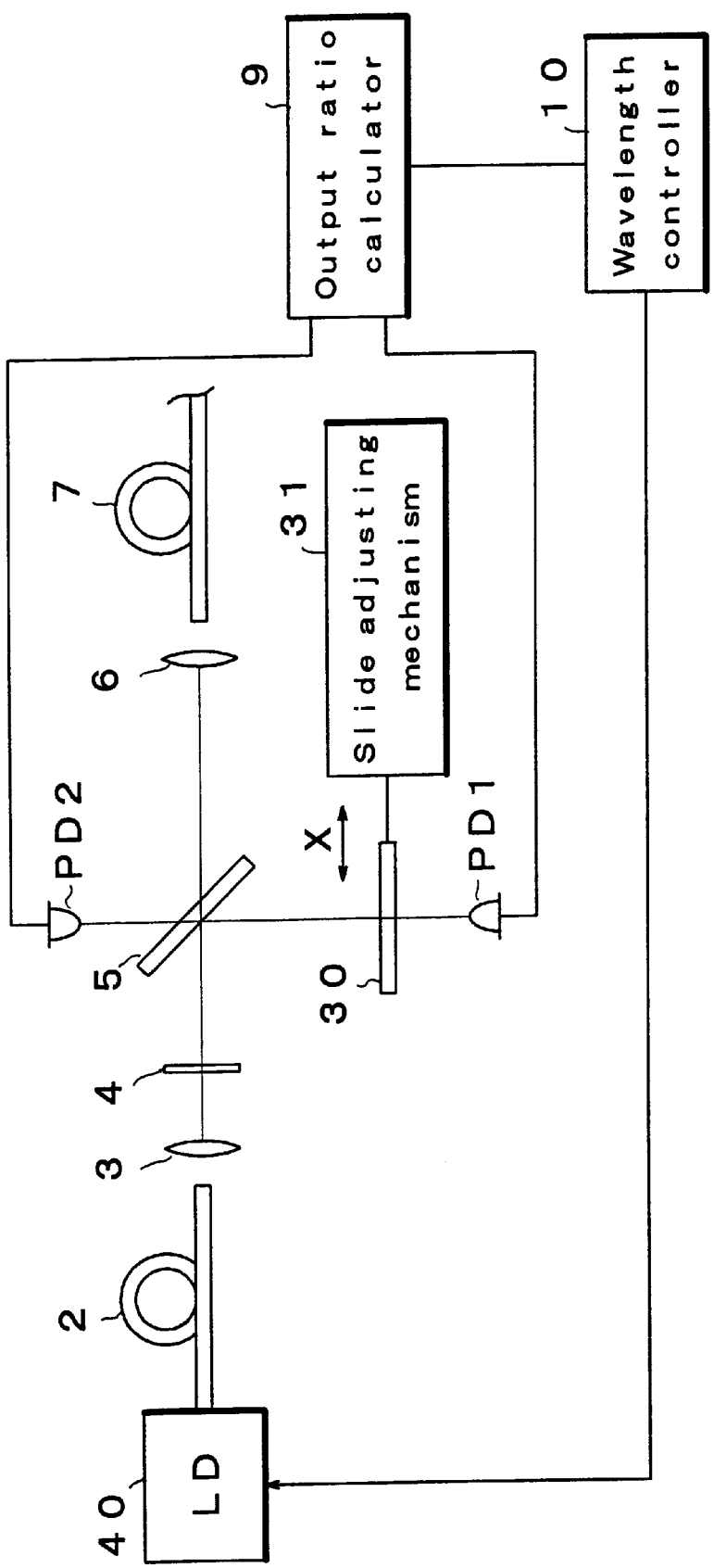
FIG. 8 is a block diagram showing an entire constitution of a laser light source apparatus in a second embodiment of the invention.

A second embodiment of the invention is described below while referring to FIG. 8 and FIG. 9. In this embodiment, the center wavelength of the band pass filter can be adjusted from outside. The same parts as in the first embodiment described above are identified with same reference numerals, and duplicate description is omitted. In this embodiment, an interference optical filter 30 is used inset of the optical band pass filter 8. The interference optical filter 30 is able to change the transmitting wavelength of incident light continuously by a incident position in the longitudinal direction (X-axis) of its substrate. A slide mechanism 31 is to change the incident position by sliding this interference optical filter 30 by a slight distance in the X-axis direction mechanically while keeping vertical to the laser beam. The other constitution is same as in the first embodiment described above.

The interference optical filter 30 is, as disclosed in U.S. Pat. No. 4,957,371, issued to Pellicori et al., designed to change continuously the optical thickness of the passing wavelength, by alternately laminating high refractive index films and low refractive index films. The interference optical filter 30 used in the embodiment is explained by referring to FIG. 9. The interference optical filter 30 is composed by evaporating multiple layers of substance on a substrate 41 of glass, silicon, etc. The substrate 41 is made of a material high in transmittance of light in a range of practical wavelength, and dielectric or semiconductor is used. In this embodiment, quartz glass is used. On the substrate 41, a multi-layer film 42 of vapor deposition substance, such as dielectric, semiconductor or others high in light transmittance in the practical wavelength range is evaporated. The multi-layer film 42 is composed of, as shown in the diagram, a lower layer 43, a cavity layer 44, and an upper layer 45. On the bottom surface of the substrate 41, an anti-reflection film 46 is formed by evaporation.

Herein, substances used as vapor deposition materials for the multi-layer film 42 and anti-reflection film 46 are, for example, $SiO_2$ (refractive index n=1.46), $Ta_2O_5$ (n=2.15), Si (n=3.46), $Al_2O_3$, $Si_2N_4$, MgF, and so on. In this embodiment, the multi-layer films 43 and 45 are formed by laminating and evaporating low refractive index films and high refractive index films alternately. Herein, the relation of film thickness d, transmission wavelength $\lambda$, and refractive index is n defined as follows.

$$\lambda = 4nd \quad (1)$$

That is, the optical thickness nd of each layer is $\lambda/4$. By alternately laminating low refractive index films and high refractive index films, the full width at half maximum (FWHM) of peak of transmittance is decreased. The relation of film thickness $d_c$ of cavity layer 44, transmission wavelength $\lambda$, and refractive index n is defined as follows.

$$\lambda = 2nd_c \quad (2)$$

That is, the optical thickness $nd_c$ of the cavity layer 24 is $\lambda/2$.

Since the interference optical filter 30 of the embodiment has the relation of the transmission wavelength and film thickness as defined in formulas (1) and (2), the substrate 41 is a slender plate, the refractive indexes of the multi-layer film 42 are constant, and the film thickness is changed continuously, so that the transmission wavelength $\lambda$ may vary. The transmission wavelength of this wavelength variable type interference optical filter 30 is $\lambda_a$ to $\lambda_c$ ($\lambda_a<\lambda_c$), and the transmission wavelength at the middle point ($x=x_b$) is $\lambda_b$. The upper and lower multi-layer films 43, 45 are composed by alternately laminating respectively a first vapor deposition substance films of a first refractive index $n_1$ and a second vapor deposition substance films of a second refractive index $n_2$ lower than the refractive index $n_1$. That is, as the circular portion in FIG. 9(a) is magnified in FIG. 9(c), each film thickness is changed continuously. In FIG. 9(c), the low refractive index films of the lower multi-layer film 43 are supposed to be 43L and high refractive index films to be 43H, and the low refractive index films of the upper multi-layer film 45 are supposed to be 45L and high refractive index films to be 45H. For the transmission wavelength $\lambda_a$ of the end portion $x_a$ on the x-axis of the filter in FIG. 9(a), it is set to establish the formulas (1) and (2) in the low refractive index films and high refractive index films, respectively. Similarly, for the transmission wavelengths $\lambda_b$, $\lambda_c$ at positions $x_b$, $x_c$ on the substrate 41, the film thickness is set so as to establish the formulas (1) and (2) at the wavelengths $\lambda_b$, $\lambda_c$. Therefore, each film thickness of the layer changes continuously from position $x_a$ to $x_c$ on the x-axis as shown in the diagram, and the film thickness increases toward the positive direction of the x-axis.

Such continuous change of film thickness is realized by disposing the substrate obliquely so as to change continuously the interval to the evaporation source, when evaporating and forming the multi-layer film 42 on the substrate 41.

Instead of changing continuously the film thicknesses of the interference optical filter 30, while keeping the film thicknesses constant, the refractive indexes $n_1$, $n_2$ of the multi-layer film 42 may be changed continuously in the x-axis direction, so that the optical thicknesses may be varied continuously.

Thus constituted interference optical filter 30 has a light transmission characteristic in a narrow band. Accordingly, by moving the light incident position in the interference optical filter 30 mechanically in the X-axis direction by using the slide adjusting mechanism 31, the transmitted wavelength can be changed continuously. In this way, since the wavelength of the incident light into the photo diodes PD1, PD2 is varied by the slide adjusting mechanism 31, the locking wavelength can be changed.

Figure 10:
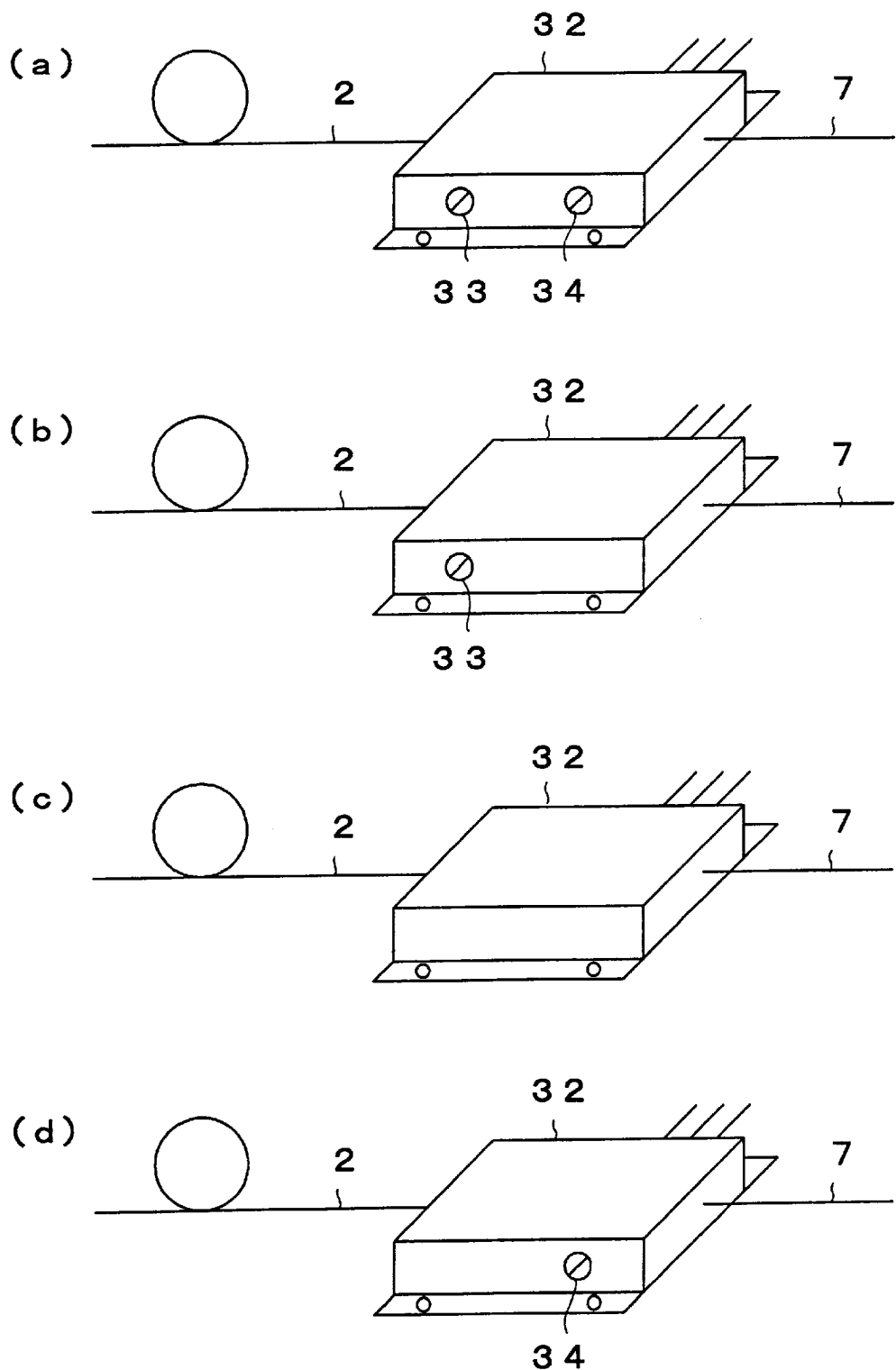
FIG. 10(a) through FIG. 10(d) are perspective view showing a constitution of a light splitting and wavelength locking module in the second embodiment.

FIG. 10(a) is a perspective view showing a state of accommodating the splitting and wavelength locking portion, other than the laser light source of the invention into one case 32.

To change the emission wavelength largely, by tuning the adjusting knob 33 of the slide adjusting mechanism 31 and changing the incident position of the incident light into the interference optical filter 30, the transmission wavelength $\lambda$ of the interference optical filter 30 shown in FIGS. 3(b), (c) can be changed. In this case, as the cut filter 4, a filter having a corresponding characteristic is used. Thus, the emission possible wavelength can be changed largely. Hence, by roughly adjusting the emission wavelength by the input position into the interference optical filter 30, and finely adjusting the wavelength by changing the reference voltage of the reference voltage adjuster 17, the user can set at a desired wavelength. Thus, in the invention, by using one optical element only, the wavelength can be accurately controlled.

In the second embodiment, it is designed to adjust the knobs 33, 34 of the slide adjusting mechanism 31 and variable resistor VR1 from outside of the case, but as shown in FIG. 10(b), it may be also designed to change the wavelength by the knob 33 of the slide adjusting mechanism 31 only, without using reference voltage adjuster by variable resistor VR1.

Alternatively, as shown in FIG. 10(c), by setting at a required wavelength at the time of manufacture, it may be designed to prohibit adjustment of emission wavelength of the laser light source without exposing the knob 33 for the slide adjusting mechanism 31 and the knob 34 of the variable resistor for fine adjustment outside of the case. Thus, without demanding the user to adjust the wavelength, the laser light source apparatus having stabilized emission wavelength is realized in a very simple constitution, and airtight sealing is also easy.

Or, without exposing the knob 33 of the slide adjusting mechanism 31 outside of the case 32, as shown in FIG. 10(d), only the knob 34 of variable resistor for fine adjustment may be available for adjustment. In this case, by setting to the required wavelength by the slide adjusting mechanism at the time of manufacture, the user can finely adjust the emission wavelength in a specified wavelength range.

Figure 11:
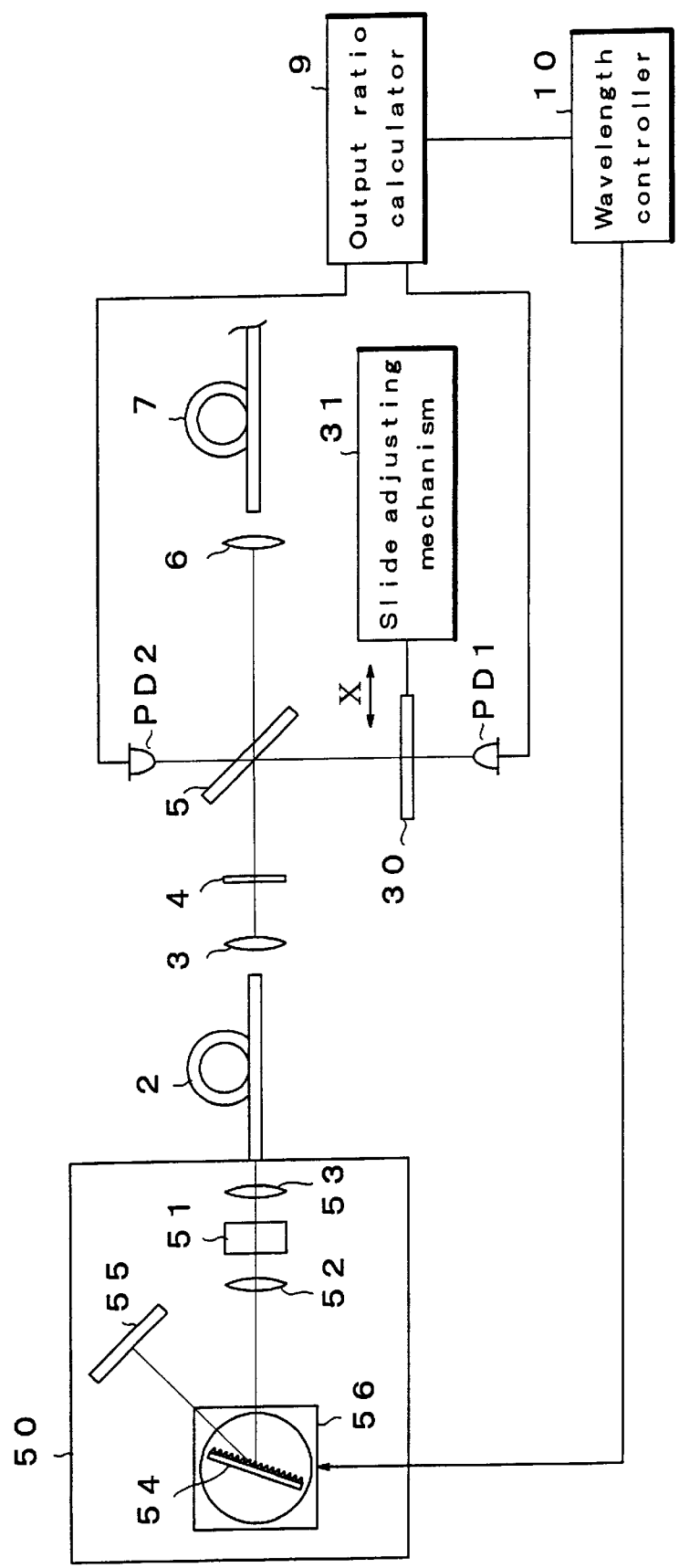
FIG. 11 is a block diagram showing an entire constitution of a laser light source apparatus in a third embodiment of the invention.

A third embodiment of the invention is described below while referring to FIG. 11. In this embodiment, instead of the laser diode 1 in the second embodiment, a wavelength variable laser light source 50 is used. The wavelength variable laser light source 50 comprises a laser diode 51, lenses 52 and 53, a diffraction grating 54, a mirror 55, and a turntable 56. The one side of the laser diode 51 is coated with a no-reflection layer. The lens 52 and diffraction grating 54 are disposed at the side of the laser diode 51. The mirror 55 is for reflecting the diffracted light, in the incident direction on the exit surface. An external resonator is formed by one exit surface of the laser diode 51 and the mirror 55. The diffraction grating 54 is held on the turntable 56, and by varying its angle of rotation, the emission wavelength is changed, for example, in a range of about 100 nm. The incident end of the optical fiber 2 is arranged facing to the exit surface side of the laser diode 51 through the lens 53. In this case, the emission wavelength of the wavelength variable laser light source 50 is changed as the turntable 56 rotates on the basis of the wavelength control signal issued from the wavelength controller 10.

Figure 12:
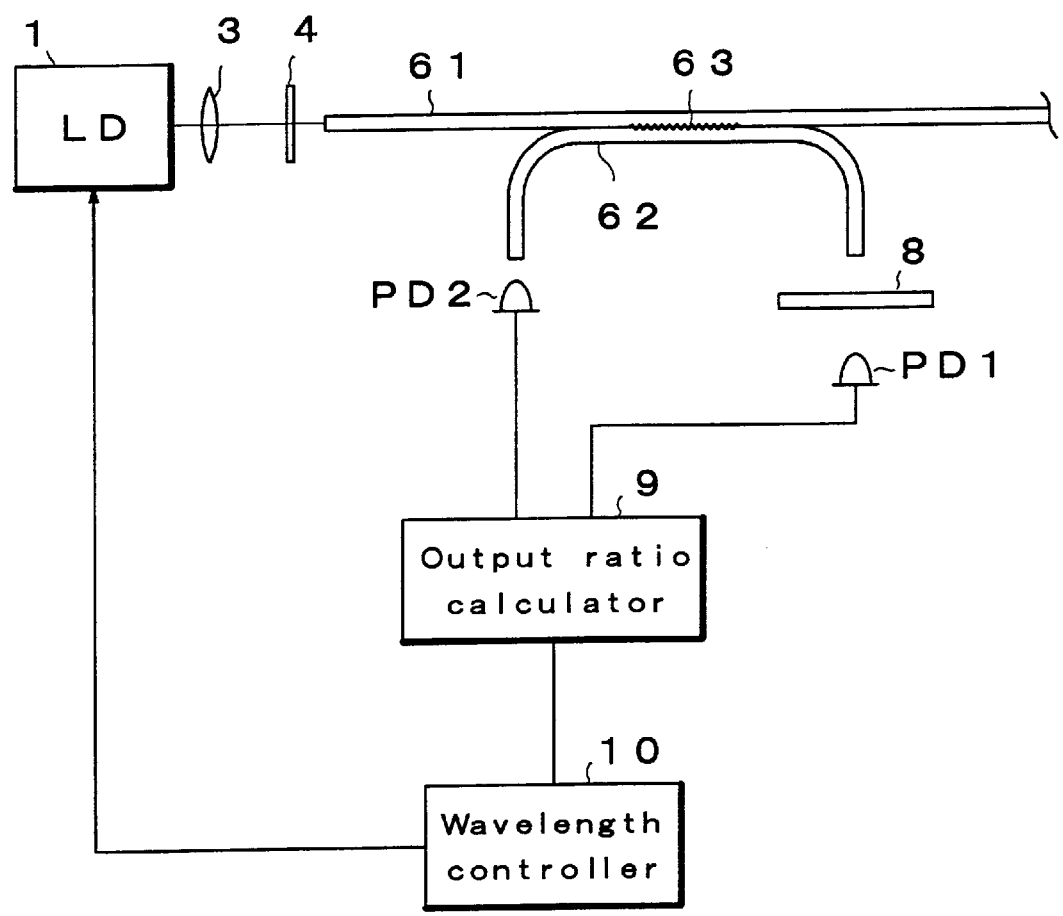
FIG. 12 is a block diagram showing an entire constitution of a laser light source apparatus in a fourth embodiment of the invention.

A fourth embodiment of the invention is described below while referring to FIG. 12. In this embodiment, instead of the beam splitter 5 of the abovementioned embodiment, the beam splitter is formed by fusing two optical fibers. In this embodiment, the laser light emitted from the laser diode 1 is guided into an optical fiber 61 through the lens 3 and cut filter 4. The optical fiber 61 is directly connected to the measuring device or light communication appliance. In part of the optical fiber 61, other optical fiber 62 is disposed closely, and its part is fused. Part of the laser light passing through the optical fiber 61 is split to the optical fiber 62 by the fused part 63, and this light is guided into a photo diode PD1, a first photo detector, through the optical band pass filter 8. To receive the light reflected by the optical band pass filter 8, a photo diode PD2 is provided as a second photo detector at other end of the optical fiber 62. Thus, part of the reflected light of the optical band pass filter 8 can be received by the photo diode PD2. The other constitution is same as in the foregoing first embodiment. Also same as in the second embodiment, using the interference optical fiber 30 and slide adjusting mechanism 31, the incident position may be shifted in the X-axis direction. In this case, the beam splitter 5 using glass substrate is not needed, and the lens 6 is saved, and hence the light splitting and wavelength locking module may be formed in a very small size. The number of parts is decreased and the price is lowered, at the same time.

In the first and second embodiments, as signal processing circuit, the adder, subtracter and divider for calculating their output ratio are used, but it may be also constituted to calculate directly the ratio of the outputs of the I/V converter 11a and amplifier 12. Furthermore, without using the cut filter 4 as shown in FIGS. 3(b), (c), the lock point may be set at two positions of the transmission and reception characteristic. In this case, the emission wavelength may be fixed at one of the two lock positions depending on the moving direction of the error signal.

In the first, second and fourth embodiments, the laser diode 1 is used as laser light source, but other laser light source may be used. In the first to third embodiments, the beam splitter evaporating metal or dielectric multi-layer films evaporated on glass is used, and in the fourth embodiment, the beam splitter formed by using two optical fibers and fusing in part is used, but other various light splitting elements may be used as far as the light splitting element is composed of two inputs and two outputs by using optical plane waveguide and intersecting or coupling them.

In the foregoing embodiments, in the output ratio calculator, the amplifier 12 is used for amplifying the output of the I/V converter 11b, but the emission wavelength may be fixed in a lowered state of the output level of the photo diode PD2. When the splitting ratio N of the beam splitter 5 is sufficiently large, the output levels of the photo diodes PD1 and PD2 are nearly equal to each other, so that the amplifier 12 is not necessary.

Figure 13:
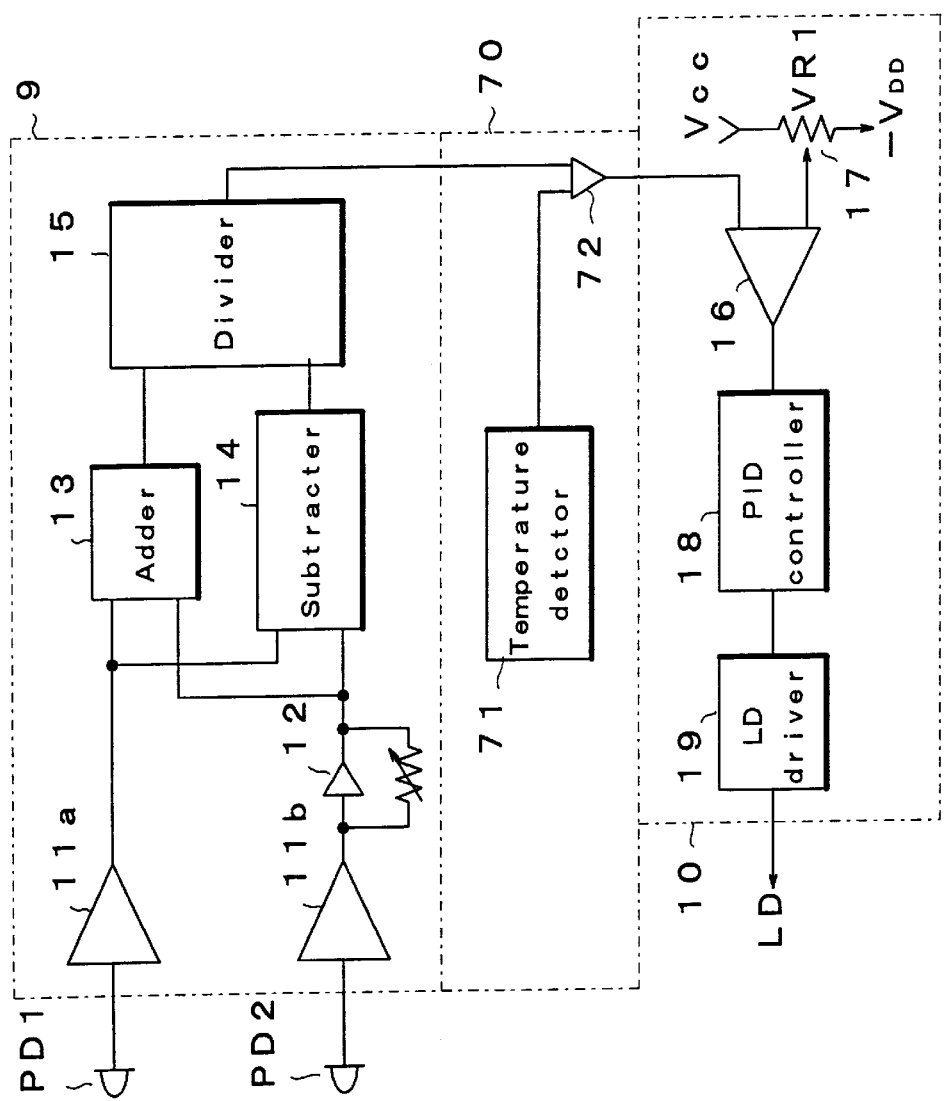
FIG. 13 is a block diagram showing a constitution of an output ratio calculator, a temperature compensator and a wavelength controller in a laser light source apparatus in a fifth embodiment of the invention.

A laser light source apparatus according to a fifth embodiment of the invention is described below. In this embodiment, as compared with the first and fourth embodiments in which the optical band pass filter has a temperature dependency, it is intended to produce a light source of a constant wavelength regardless of the ambient temperature. FIG. 13 shows a constitution of temperature compensator 70 for compensating the output ratio calculated from the output ratio calculator 9 for temperature. The temperature compensator 70 includes a temperature detector 71 and an adder 72. The temperature detector 71 detects the ambient temperature of the optical band pass filter 8, and output thereof is given to the adder 72. Since the output from the output ratio calculator 9 has an almost linear temperature characteristic to temperature such as the curve A in FIG. 14(a), the temperature detection signal is added to the adder 72 so as to cancel it. In this manner, the temperature can be corrected very easily, and as shown in the curve B in FIG. 14(b), the laser light having almost constant wavelength characteristic regardless of ambient temperature can be issued. Or, by adding the output of the temperature detector 71 to a Peltier element, the temperature may be controlled so that the temperature of the band pass filter 8 may be constant.

In the interference optical filter in the second and third embodiments, similarly, by detecting the ambient temperature and compensating for temperature, the laser light having an almost constant wavelength characteristic regardless of the ambient temperature may be produced.

Figure 15:
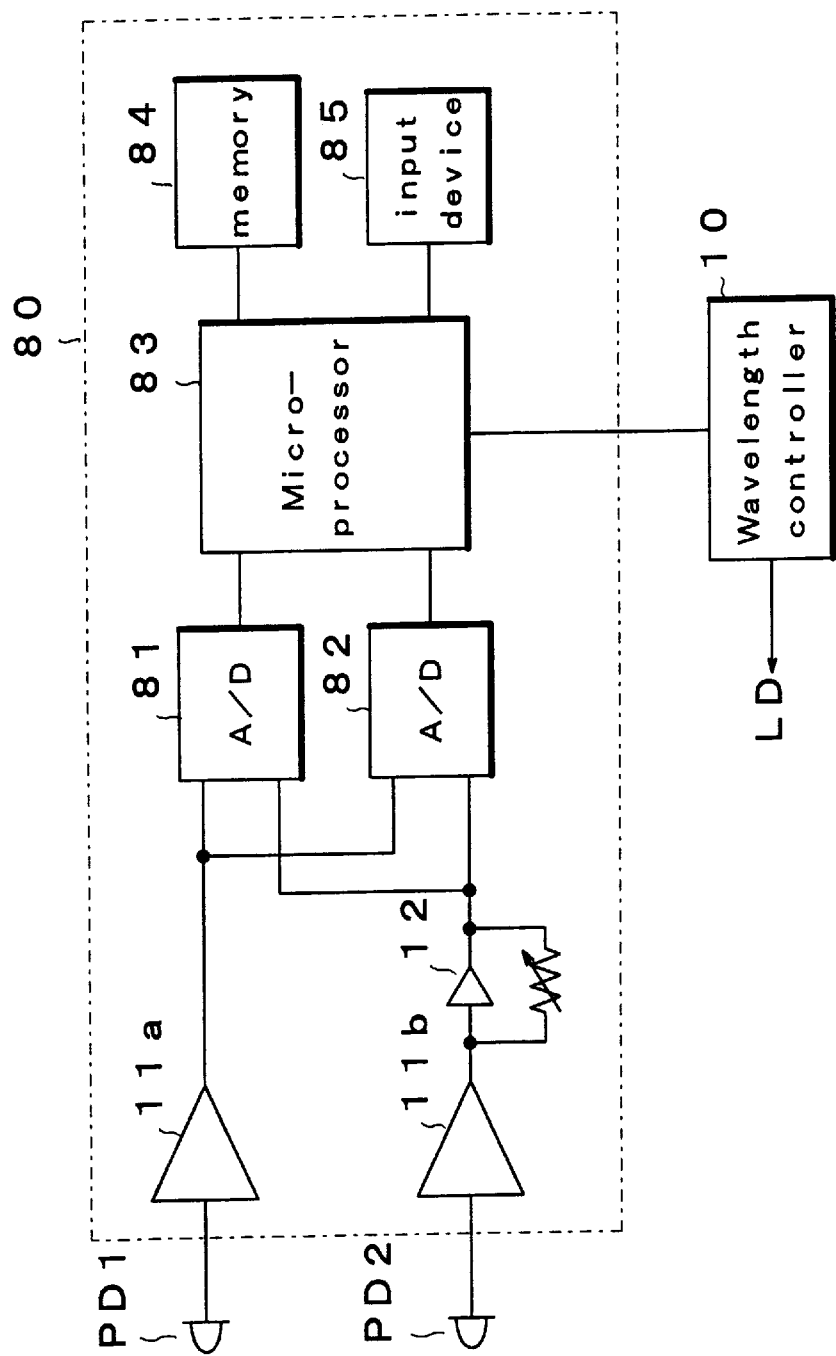
FIG. 15 is a block diagram showing an entire constitution of a laser light source apparatus in a sixth embodiment of the invention.

A sixth embodiment of the invention is described by referring to FIG. 15. In the fifth embodiment, instead of the output ratio calculator 9 and the wavelength controller 10 of the first to fifth embodiments, a processing unit 80 is used for controlling the wavelength of the laser diode 1. FIG. 15 is a block diagram showing an entire constitution of a laser light source apparatus of laser light source according to the sixth embodiment, and same parts as in the first to third embodiments are identified with same reference numerals and detailed descriptions are omitted. In this embodiment, the output signals of the I/V converter 11a and amplifier 12 are fed to A/D converters 81 and 82, respectively. The converted digital signals A1, and B1 are fed to a microprocessor 83. A memory 84 and an input device 85 such as a keyboard are connected to the microprocessor 83. The microprocessor 83 reads the converted signals and calculates control value according to following steps, and controls the wavelength controller 10.

Figure 16:
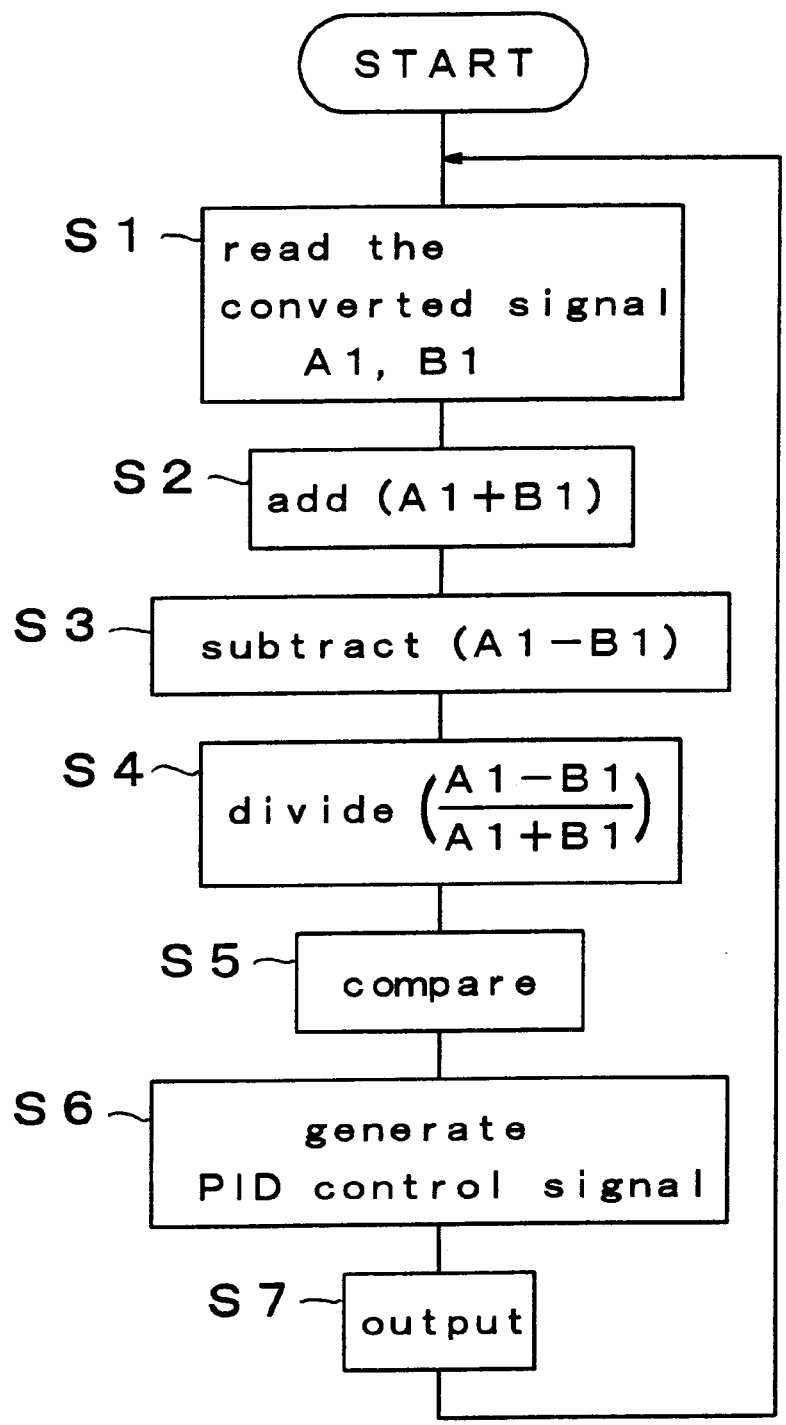
FIG. 16 is a flow chart showing an operation of a processing unit of the sixth embodiment.

FIG. 16 shows the operation of the microprocessor 83. In a step S1, the microprocessor 83 receives the converted signals A1 and B1 of the A/D converters 81 and 82. In steps S2 and S3, the microprocessor 83 adds and subtracts the values A1 and B1. In step S4, the microprocessor 83 divides the values and obtains (A1−B1)/(A1+B1). Then in a step S5, the microprocessor 83 compares the divided value to the predetermined reference value and obtains an error value. Then in a step S6, the microprocessor 83 generates a control signal such as PID control signal based on the error value. And finally in a step S7, the microprocessor 83 outputs the control signal to the laser diode driver wavelength controller 10. In the this embodiment, the microprocessor 83 may also calculate the ratio A1/B1 directly.

According to the invention as described specifically above, using the beam splitter and optical filter, the emission wavelength of the light source is controlled from the ratio of the transmitted light and reflected light of the optical filter. Therefore, the beam splitter can be incorporated, and by setting its splitting ratio large, a stabilized laser light of high precision can be obtained regardless of effects of splitting ratio, wavelength dependency and other properties of the beam splitter.

What we claim is:

1. A laser light source apparatus comprising:
   a laser light source which generates laser light capable of continuously varying the wavelength thereof;
   a beam splitter for receiving laser light from said laser light source, and splitting the incident laser light into transmitted light and split light;
   an optical filter for receiving said split light from said beam splitter, and transmitting light of specified wavelength and reflecting the remainder to enter again into said beam splitter;
   a first photo detector for receiving the transmitted light from said optical filter;
   a second photo detector for receiving the light passing through said beam splitter out of the split light reflected by said optical filter;
   an output ratio calculator which calculates the output ratio of reception levels delivered from said first and second photo detectors; and
   a wavelength controller which controls the emission wavelength of said laser light source in a manner that the output ratio by said output ratio calculator becomes a specified value.

2. A laser light source apparatus according to claim 1, wherein said beam splitter is composed by evaporating dielectric multi-layer films on a transparent substrate.

3. A laser light source apparatus according to claim 1, wherein said beam splitter is composed by evaporating metal film on a transparent substrate.

4. A laser light source apparatus according to claim 1, wherein said output ratio calculator comprises:
   an adder for calculating the sum of the output signals of said first and second photo detectors;
   a subtracter for calculating the difference of the output signals of said first and second photo detectors; and
   a divider for calculating the output ratio of said adder and said subtracter.

5. A laser light source apparatus according to claim 1, wherein said wavelength controller comprises:
   an error detector for detecting the difference of the output ratio calculated by said output ratio calculator and the specified reference value;
   a reference value adjuster for setting reference value in said error detector; and
   a light source driver for controlling the emission wavelength of said laser light source in a manner that the error detected by said error detector becomes zero.

6. A laser light source apparatus according to claim 5, wherein said reference value adjuster generates a reference value in a specified range.

7. A laser light source apparatus according to claim 1, wherein said laser light source is a laser diode, and said light source driver changes the emission wavelength by changing the driving current supplied in said laser light source.

8. A laser light source apparatus according to claim 1, wherein said laser light source is a laser diode, and said light source driver changes the emission wavelength by changing the temperature of said laser light source.

9. A laser light source apparatus according to claim 1, further comprising:
   a cut filter of which cut-off wavelength is shorter than the possible setting wavelength range of the laser light source apparatus being provided between said laser light source and said beam splitter.

10. A laser light source apparatus according to claim 1, wherein
    said optical filter is composed of an interference optical filter laminating low refractive index films and high refractive index films having optical thicknesses of $\lambda/4$ for transmission wavelength $\lambda$ on a substrate alternately in multiple layers.

11. A laser light source apparatus according to claim 1, wherein said beam splitter is composed of two optical fibers fitted tightly and fused a part thereof.

12. A laser light source apparatus according to claim 1, further comprising:
    a temperature compensator for compensating the output ratio calculated by said output ratio calculator for temperature, including a temperature detector for measuring the ambient temperature of said optical filter.

13. A laser light source apparatus according to claim 1, wherein said laser light source is an external resonance type laser light source having a laser diode and a resonator provided outside of said laser diode.

14. A laser light source apparatus according to claim 1, wherein
    said output ratio calculator includes a gain controller for equalizing the output levels of said first and second photo detectors when said laser light source emits the center of the possible setting wavelength range.

15. A laser light source apparatus according to claim 1, wherein
    said beam splitter has the value of N of 100 or more, supposing its splitting and transmitting ratio to be 1:N.

16. A laser light source apparatus comprising:
    a laser light source which generates laser light capable of continuously varying the wavelength thereof;
    a beam splitter for receiving laser light from said laser light source, and splitting the incident laser light into transmitted light and split light;
    an optical filter composed of an interference optical filter laminating low refractive index films and high refractive index films having optical thicknesses of $\lambda/4$ for transmission wavelength $\lambda$ on a substrate alternately in multiple layers, and continuously changing the optical thicknesses in a specified direction of said substrate so that the transmission wavelength $\lambda$ changes continuously in a specific direction of the substrate, for receiving said split light from said beam splitter, and transmitting light of specified wavelength and reflecting the remainder to enter again into said beam splitter;
    a first photo detector for receiving the light transmitted through said optical filter;
    a second photo detector for receiving the light passing through said beam splitter out of the split light reflected by said optical filter;
    an output ratio calculator which calculates the output ratio of reception levels delivered from said first and second photo detectors;

a wavelength controller which controls the emission wavelength of said laser light source in a manner that the output ratio by said output ratio calculator becomes a specified value; and a slide adjusting mechanism for changing the incident position of said split and reflected light into said optical filter continuously in said specified direction.

17. A laser light source apparatus according to claim 16, wherein said output ratio calculator comprises:

an adder for calculating the sum of the output signals of said first and second photo detectors;

a subtracter for calculating the difference of the output signals of said first and second photo detectors; and a divider for calculating the output ratio of said adder and said subtracter.

18. A laser light source apparatus according to claim 16, wherein said wavelength controller comprises:

an error detector for detecting the difference of the output ratio calculated by said output ratio calculator and the specified reference value;

a reference value adjuster for setting reference value in said error detector; and a light source driver for controlling the emission wavelength of said laser light source in a manner that the error detected by said error detector becomes zero.

19. A laser light source apparatus according to claim 18, wherein the reference value adjuster generates a reference value in a specified range.

20. A laser light source apparatus according to claim 16, wherein said laser light source is a laser diode, and said light source driver changes the emission wavelength by changing the driving current supplied in said laser light source.

21. A wavelength stabilizing apparatus of laser light source of claim 16, wherein said laser light source is a laser diode, and said light source driver changes the emission wavelength by changing the temperature of said laser light source.

22. A wavelength stabilizing apparatus of laser light source of claim 16, wherein a cut filter of which cut-off wavelength is shorter than the possible setting wavelength range of the laser light source apparatus is provided between said laser light source and said beam splitter.

23. A laser light source apparatus according to claim 16, wherein said beam splitter is composed of two optical fibers fitted tightly and fused a part thereof.

24. A laser light source apparatus according to claim 16, further comprising:

a temperature compensator for compensating the output ratio calculated by said output ratio calculator for temperature, including a temperature detector for measuring the ambient temperature of said optical filter.

25. A laser light source apparatus according to claim 16, wherein said laser light source is an external resonance type laser light source having a laser diode and a resonator provided outside of said laser diode.

26. A laser light source apparatus according to claim 16, wherein said output ratio calculator includes a gain controller for equalizing the output levels of said first and second photo detectors when said laser light source emits the center of the possible setting wavelength range.

27. A laser light source apparatus according to claim 16, wherein said beam splitter has the value of N of 100 or more, supposing its splitting and transmitting ratio to be 1:N.

28. A laser light source apparatus comprising:

a laser light source which generates laser light capable of continuously varying the wavelength thereof;

a beam splitter for receiving laser light from said laser light source, and splitting the incident laser light into transmitted light and split light;

an optical filter for receiving said split light from said beam splitter, and transmitting light of specified wavelength and reflecting the remainder to enter again into said beam splitter;

a first photo detector for receiving the transmitted light from said optical filter;

a second photo detector for receiving the light passing through said beam splitter out of the split light reflected by said optical filter; and a processing unit which controls said laser light source based on the signals of said first and second photo detectors, for performing the following operations:

detecting the ratio of the output signals of said first and second photo detectors, detecting the difference between said detected ratio and a predetermined reference value, and outputting the control signal for controlling the emission wavelength of said laser light source in a manner that said difference becomes zero.

29. A laser light source apparatus according to claim 28, wherein said optical filter is composed of an interference optical filter laminating low refractive index films and high refractive index films having optical thicknesses of $\lambda/4$ for transmission wavelength $\lambda$ on a substrate alternately in multiple layers.

30. A laser light source apparatus comprising:

a laser light source which generates laser light capable of continuously varying the wavelength thereof;

a beam splitter for receiving laser light from said laser light source, and splitting the incident laser light into transmitted light and split light;

an optical filter composed as an interference optical filter laminating low refractive index films and high refractive index films having optical thicknesses of $\lambda/4$ for transmission wavelength $\lambda$ on a substrate alternately in multiple layers, and continuously changing the optical thicknesses so that the transmission wavelength $\lambda$ change continuously in a specific direction of the substrate, for receiving light of a laser light source capable of changing wavelength of light continuously, for receiving said split light from said beam splitter, and transmitting light of specified wavelength and reflecting the remainder to enter again into said beam splitter;

a first photo detector for receiving the transmitted light from said optical filter;

a second photo detector for receiving the light passing through said beam splitter out of the split light reflected by said optical filter; and a processing unit which controls said laser light source based on the signals of said first and second photo detectors, for performing the following operations:

detecting the ratio of the output signals of said first and second photo detectors, detecting the difference between said detected ratio and a predetermined reference value, and outputting the control signal for controlling the emission wavelength of said laser light source in a manner that said difference becomes zero.

* * * * *